(12) United States Patent
Costrini et al.

(10) Patent No.: US 7,001,783 B2
(45) Date of Patent: Feb. 21, 2006

(54) MASK SCHEMES FOR PATTERNING MAGNETIC TUNNEL JUNCTIONS

(75) Inventors: Gregory Costrini, Hopewell Junction, NY (US); Frank Findeis, Munich (DE); Gill Yong Lee, Boissise-le-Roi (FR); Chanro Park, Samois sur Seine (FR)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/868,328

(22) Filed: Jun. 15, 2004

(65) Prior Publication Data

US 2005/0277207 A1 Dec. 15, 2005

(51) Int. Cl.
*H01L 21/00* (2006.01)
(52) U.S. Cl. .......................... 438/3; 438/257
(58) Field of Classification Search ............... 438/3, 438/257
See application file for complete search history.

(56) References Cited

U.S. PATENT DOCUMENTS

| | | | |
|---|---|---|---|
| 5,940,319 A | 8/1999 | Durlam et al. | |
| 6,153,443 A | 11/2000 | Durlam et al. | |
| 6,426,012 B1 | 7/2002 | O'Sullivan et al. | |
| 6,518,588 B1 | 2/2003 | Parkin et al. | |
| 6,638,774 B1 | 10/2003 | Raberg | |
| 6,703,676 B1 | 3/2004 | Hirai et al. | |
| 6,709,874 B1 | 3/2004 | Ning | |
| 6,713,802 B1 | 3/2004 | Lee | |
| 2004/0026369 A1 | 2/2004 | Ying et al. | |
| 2004/0043579 A1 | 3/2004 | Nuetzel et al. | |
| 2004/0229430 A1 * | 11/2004 | Findeis et al. | 438/257 |

* cited by examiner

*Primary Examiner*—David Nelms
*Assistant Examiner*—Quoc Hoang
(74) *Attorney, Agent, or Firm*—Slater & Matsil, L.L.P.

(57) ABSTRACT

Methods of patterning magnetic tunnel junctions (MTJ's) of magnetic memory devices that avoid shorting magnetic memory cells to upper levels of conductive lines during etching processes. One method involves using a hard mask having two material layers to pattern the lower magnetic material layers of an MTJ. The first material of the hard mask is thin and comprises an etch-resistant material. The second material of the hard mask deposited over the first material is thicker and is less etch-resistant than the first material. At least a portion of the second material is sacrificially removed during the etch process of the lower magnetic material layers. A conformal or non-conformal material may be used as the second material of the hard mask. The hard mask used to pattern lower magnetic materials of an MTJ may comprise a single layer of non-conformal material.

20 Claims, 6 Drawing Sheets

MASK SCHEMES FOR PATTERNING MAGNETIC TUNNEL JUNCTIONS

TECHNICAL FIELD

The present invention relates generally to semiconductor devices, and more particularly to the fabrication of magnetic memory devices.

BACKGROUND

A recent development in semiconductor memory devices involves spin electronics, which combines semiconductor technology and magnetics. The spin of electrons, rather than the charge, is used to indicate the presence of a "1" or "0." One such spin electronic device is a magnetic random access memory (MRAM) device which includes conductive lines (wordlines and bitlines) positioned in a different direction, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the component's resistive state.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be powered up and has the capability of "remembering" the stored data. Therefore, it is expected that MRAM devices will replace flash memory, DRAM and static random access memory devices (SRAM) devices in electronic applications where a memory device is needed.

Because MRAM devices operate differently than traditional memory devices, they introduce design and manufacturing challenges. For example, the magnetic material layers and other metal layers that form the magnetic memory cells of an MRAM device are difficult to etch and have a high sputter component, resulting in re-deposition of conductive material in undesired locations.

SUMMARY OF THE INVENTION

Embodiments of the present invention achieve technical advantages by providing novel dual mask schemes for patterning magnetic memory devices. Embodiments of the present invention provide methods of patterning MTJ's of magnetic memory devices that prevent the formation of metal fences on the sidewalls of various material layers of the devices.

In accordance with a preferred embodiment of the present invention, a method of manufacturing a semiconductor device includes providing a workpiece, depositing a first magnetic layer over the workpiece, depositing a tunnel insulator over the first magnetic layer, and depositing a second magnetic layer over the tunnel insulator, wherein the second magnetic layer, tunnel insulator and first magnetic layer form a magnetic stack. A first hard mask is deposited over the second magnetic layer, the first hard mask is patterned, and the second magnetic layer and the tunnel insulator are patterned using the first hard mask as a mask. A first material is deposited over the first hard mask, and a second material is deposited over the first material, wherein the first material and second material form a second hard mask. The second material and the first material are patterned, and the first magnetic layer is patterned using the second hard mask as a mask, wherein the patterned first magnetic layer, tunnel insulator, and second magnetic layer comprise at least one MTJ.

In accordance with another preferred embodiment of the present invention, a method of manufacturing a semiconductor device includes providing a workpiece, depositing a first magnetic layer over the workpiece, depositing a tunnel insulator over the first magnetic layer, and depositing a second magnetic layer over the tunnel insulator, wherein the second magnetic layer, tunnel insulator and first magnetic layer form a magnetic stack. A first hard mask is deposited over the second magnetic layer, the first hard mask is patterned, and the second magnetic layer and the tunnel insulator are patterned using the first hard mask as a mask. A non-conformal hard mask is deposited over the second magnetic layer, the non-conformal hard mask is patterned, and the first magnetic layer is patterned using the non-conformal hard mask as a mask. The patterned first magnetic layer, tunnel insulator and second magnetic layer comprise at least one MTJ.

In accordance with another preferred embodiment of the present invention, a magnetic memory device includes a workpiece, a first magnetic layer disposed over the workpiece, a tunnel insulator disposed over the first magnetic layer, and a second magnetic layer disposed over the tunnel insulator. A first hard mask is disposed over the second magnetic layer, the first hard mask, the second magnetic layer, and the tunnel insulator comprising a first pattern. A second hard mask is disposed over the first hard mask and the first magnetic layer, the second hard mask and the first magnetic layer comprising a second pattern, the second pattern having a larger footprint than the first pattern. The second hard mask includes downwardly sloping sidewalls, and the first magnetic layer, the tunnel insulator and the second magnetic layer comprise at least one MTJ.

In accordance with yet another embodiment of the present invention, a semiconductor device includes a workpiece, a first insulating layer disposed over the workpiece, and a plurality of first conductive lines formed in the first insulating layer, the first conductive lines running in a first direction. A first magnetic layer is disposed over the first insulating layer and the first conductive lines, a tunnel insulator is disposed over the first magnetic layer, and a second magnetic layer is disposed over the tunnel insulator. A first hard mask is disposed over the second magnetic layer, and a first material is disposed over the first hard mask, the first material comprising a second hard mask. The first hard mask, second magnetic layer and tunnel insulator comprise a first pattern. The second hard mask and the first magnetic layer comprise a second pattern, the second pattern having a larger footprint than the first pattern. The patterned first magnetic layer, tunnel insulator and second magnetic layer comprise a plurality of magnetic tunnel junctions (MTJ's) disposed over the plurality of conductive lines.

Advantages of preferred embodiments of the present invention include providing methods of patterning MTJ's of MRAM devices that prevents shorting between the MTJ's and subsequently formed conductive lines, resulting in reduced device failures and improved yields. No additional lithography masks are required by the methods described herein.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4 through 9A and 9B illustrate cross-sectional views of an MRAM device manufactured in accordance with a preferred embodiment of the present invention, wherein a two layer hard mask is used to pattern the lower magnetic material layers of magnetic memory cells, wherein both layers of the hard mask are substantially conformal to the underlying topography of the device structure;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely field effect transistor (FET) MRAM devices. In FET MRAM devices, each magnetic memory cell is located proximate an FET that is used to access, e.g., read from or write to, the magnetic memory cell. Embodiments of the present invention may also be applied, however, to cross-point MRAM devices, other magnetic memory devices and other semiconductor devices having magnetic material layers, as examples.

Only one MTJ is shown in each of the figures. However, a plurality of MTJ's may be simultaneously formed using the manufacturing processes described herein. For example, an array of MTJ's may be patterned using embodiments of the present invention.

Figure 1:
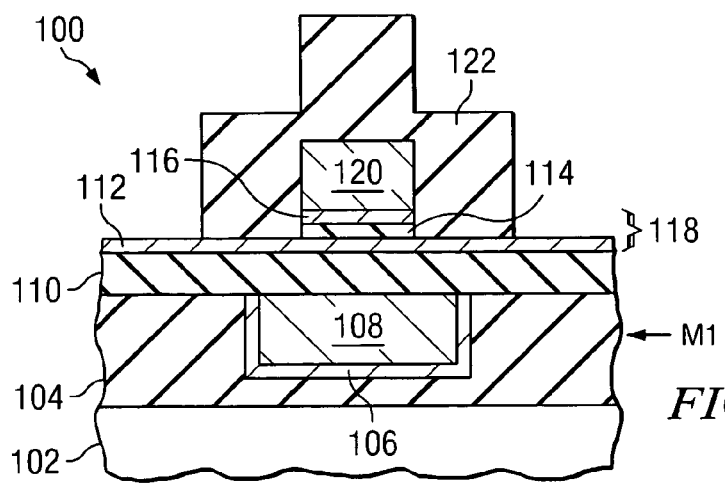
FIGS. 1 through 3 show cross-sectional views of an MRAM device in various stages using a less-preferred manufacturing method, wherein metallic fences form on the sidewalls of the hard mask used to pattern the bottom magnetic material layer, causing shorts to conductive lines in upper metallization layers.
Figure 2:
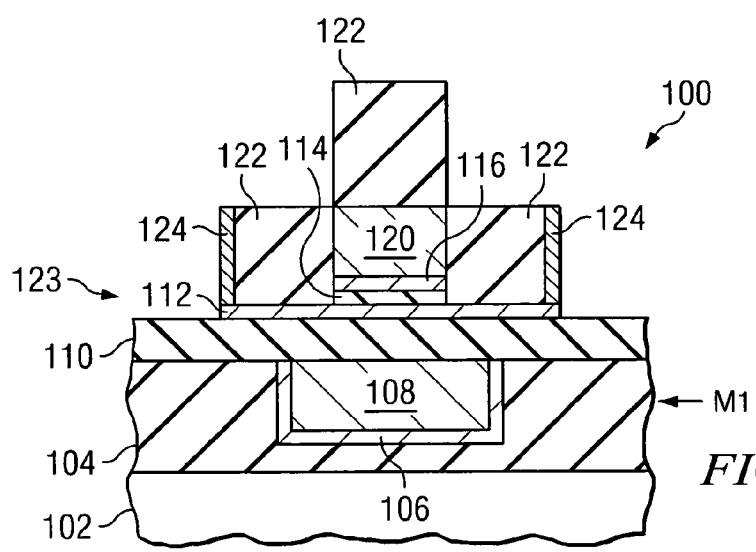
Figure 3:
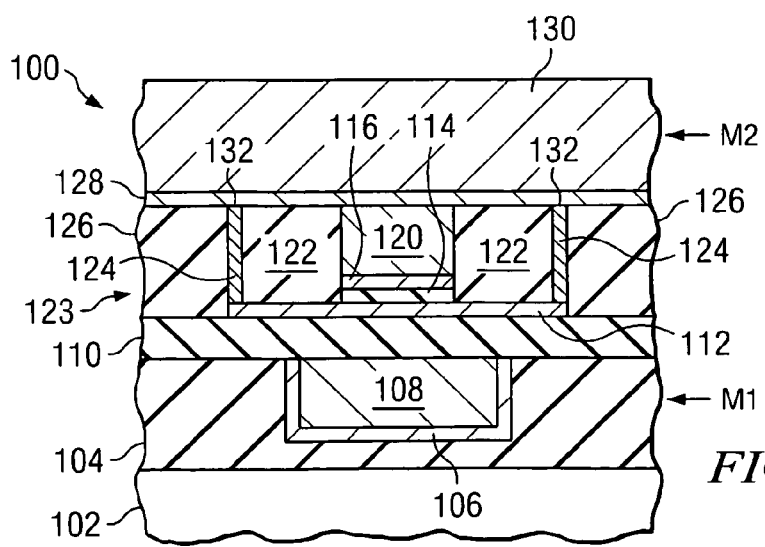

FIGS. 1 through 3 show cross-sectional views of an MRAM device 100 at various stages of manufacturing using a less-preferred method. A first insulating layer 104 is formed over a workpiece 102, and first conductive lines 106/108 are formed within the first insulating layer 104 in an M1 metallization layer or other level metallization layer. The workpiece 102 may include component regions or various circuit elements formed therein (not shown). The first conductive lines 106/108 include a conductive liner 106 formed over the patterned first insulating layer 104 and a conductive material 108, and may be formed in a damascene process, for example. A second insulating layer 110 is formed over the first insulating layer 104.

A magnetic stack 118 from which MTJ's 123 (see FIGS. 2 and 3) will be formed is deposited over the second insulating layer 110. The magnetic stack 118 includes a first magnetic layer 112 deposited over the second insulating layer 110, and a tunnel insulator 114 formed over the first magnetic layer 112. A second magnetic layer 116 is deposited over the tunnel insulator 114. The first magnetic layer 112 and the second magnetic layer 116 each typically comprise one or more layers of magnetic materials and/or metal materials, for example. The first magnetic layer 112 may comprise a seed layer of Ta and/or TaN, an antiferromagnetic layer such as PtMn disposed over the seed layer, and a plurality of magnetic material layers comprising CoFe, NiFe, CoFeB or other magnetic materials disposed over the antiferromagnetic layer, as examples, although alternatively, the first magnetic layer 112 may comprise other materials. The second magnetic layer 116 may comprise a plurality of magnetic material layers comprising CoFe, NiFe, CoFeB, other magnetic material layers, or combinations thereof, although alternatively, the second magnetic layer 116 may comprise other materials. The tunnel insulator 114 may comprise a few Angstroms of an insulator such as $AlO_x$, for example, although alternatively, other insulating materials may be used for the tunnel insulator.

To pattern the magnetic stack layers 118, a first hard mask 120 is deposited over the second magnetic layer 116. The first hard mask 120 typically comprises titanium nitride (TiN), as an example. The first hard mask 120 is patterned using traditional lithography techniques, and the second magnetic layer 116 and the tunnel insulator 114 are patterned by etching exposed portions of the second magnetic layer 116 and the tunnel insulator 114 using the first hard mask 120 as a mask.

The lower or first magnetic layer 112 of the magnetic stack 118 is typically patterned using a second hard mask 122, as shown. The second hard mask 122 may comprise about 1500 Angstroms of silicon dioxide, for example. The second hard mask 122 is conformal and takes on the same topography as the underlying first hard mask 120 and patterned second magnetic layer 116 and tunnel insulator 114, as shown. The second hard mask 122 may have regions comprising substantially vertical sidewalls that extend at about 90° angle from a planar horizontal top surface of the first magnetic layer 112, as shown. The lower or first magnetic layer 112 of the magnetic stack 118 is patterned using the second hard mask 122 as a mask, as shown in FIG. 2.

A problem in this less-preferred method of patterning an MTJ 123 is that as the first magnetic layer 112 is patterned or etched, a portion of the magnetic material 112 or other metals in the first magnetic layer 112 may be deposited or formed on the sidewalls of the second hard mask 122, forming metal fences 124, as shown in FIG. 2. PtMn and Ta both are difficult to etch and have a tendency to redeposit during etching, especially on sidewalls of features that are substantially vertical, e.g., that have an angle of around 90° with respect to a horizontal surface of the workpiece 102. For example, a sputter etch process involves physically bombarding a material surface to remove material. Often during a sputter process, portions of the material are removed simultaneously while other portions of material are deposited, with a net result of removal of material being the goal. In particular, a reactive ion etch (RIE) process is one type of etching method that may be used to etch the first magnetic layer 112. The RIE processes for PtMn and Ta have a high sputter component, which causes the creation of the metal fences 124 on the sidewalls of the second hard mask 122.

When second conductive lines 128/130 are formed in subsequent metallization layers such as layer M2 formed in insulating layer 126 as shown in FIG. 3, if metal fences 124 are present in the structure of the semiconductor device 100, shorts form at 132 where the metal fences 124 abut the conductive liner 128 of the second conductive lines 128/130. This is problematic because the shorts 132 cause device failures and decreased yields.

Therefore, what is needed in the art is a method of patterning MTJ's of MRAM devices that does not lead to shorting between the MTJ's and the upper metallization or conductive layers of the MRAM device.

A cross-sectional view of an MRAM device 200 at various stages of manufacturing in accordance with a first preferred embodiment of the present invention is shown in FIGS. 4 through 9A and 9B. Like numerals are used for the various elements in FIGS. 4 through 9A and 9B as were described with reference to FIGS. 1 through 3. To avoid repetition, each reference number shown in the diagram may not necessarily be described again in detail herein. Rather, similar materials x02, x04, x06, x08, etc. . . . are preferably used for the material layers shown as were described for FIGS. 1 through 3, where x=1 in FIGS. 1 through 3 and x=2 in FIGS. 4 through 9A and 9B. As an example, the preferred and alternative materials and dimensions described for first magnetic layer 112 in the description for FIGS. 1 through 3 are preferably also used for first magnetic layer 212 in FIGS. 4 through 9A and 9B.

Figure 4:
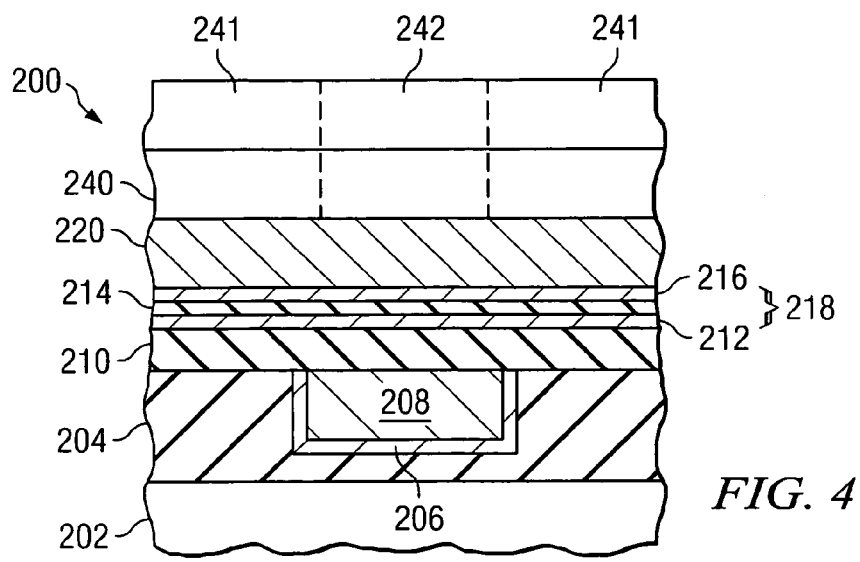

Referring first to FIG. 4, a workpiece 202 is provided. The workpiece 202 may include a semiconductor substrate comprising silicon or other semiconductor materials covered by an insulating layer, for example. The workpiece 202 may also include other active components or circuits formed in a front end of line (FEOL), not shown. The workpiece 202 may comprise silicon oxide over single-crystal silicon, for example. The workpiece 202 may include other conductive layers or other semiconductor elements, e.g. transistors, diodes, etc. Compound semiconductors, GaAs, InP, Si/Ge, or SiC, as examples, may be used in place of silicon. For example, the workpiece 202 may include component regions or various circuit elements formed therein (not shown in FIG. 4: see FET 260 in FIG. 9B).

A first insulating layer 204 is deposited over the workpiece 202. The first insulating layer 204 preferably comprises silicon dioxide and may alternatively comprise low dielectric constant materials or other insulating materials, as examples. The first insulating layer 204 may alternatively comprise other materials, for example.

A plurality of first conductive lines 206/208 are formed within the first insulating layer 204. The first conductive lines 206/208 may comprise a conductive liner 206, and a conductive material 208 disposed over and filling the liner 206, for example. Alternatively, the first conductive lines 206/208 may comprise a single material, or two or more materials, for example. The conductive material 208 may comprise copper, aluminum, or combinations thereof, as examples, although alternatively, the conductive material 208 may comprise other conductive materials. The first conductive lines 206/208 may be formed in a damascene process, for example. Alternatively, the first conductive lines 206/208 may be formed using a subtractive etch process, for example.

A second insulating layer 210 is deposited over the first insulating layer 204 and conductive lines 206/208. The second insulating layer 210 may comprise silicon dioxide or other insulators, as examples. The second insulating layer 210 may comprise an inter-level dielectric (ILD) in which vias will be formed to make contact to underlying first conductive lines 206/208 (not shown in FIG. 4: see via 258 in FIG. 9B).

A first magnetic layer 212 is deposited over the second insulating layer 210, as shown in FIG. 4. A tunnel insulator 214 is deposited over the first magnetic layer 212. A second magnetic layer 216 is deposited over the tunnel insulator 214. The first magnetic layer 212, the tunnel insulator 214, and the second magnetic layer 216 form a magnetic stack 218.

A first hard mask 220 is deposited over the second magnetic layer 216, as shown. The first hard mask 220 preferably comprises a conductive material such as TiN. Alternatively, the first hard mask 220 may comprise Ta, TaN, other materials, or combinations of TiN, Ta, TaN, and other materials, as examples. The first hard mask 220 preferably comprises a thickness of about 1500 Angstroms, although alternatively, the first hard mask 220 may comprise other dimensions. For example, the first hard mask 220 may comprise a thickness of about 2000 Angstroms or less in one embodiment.

The first hard mask 220 is then patterned with the desired pattern for the second magnetic layer 216 and the tunnel insulator 214. For example, the first hard mask 220 may be patterned by depositing an oxide mask 240 over the first hard mask 220. A photoresist 241 is deposited over the oxide mask 240, and the photoresist 241 is patterned with a pattern 242 for the second magnetic layer 216 and the tunnel insulator 214. Portions of the photoresist 241 are removed, and the pattern 242 from the photoresist 241 is transferred to the oxide mask 240. For example, the oxide mask 240 may be etched, and exposed portions of the oxide mask 240 may be removed while portions of oxide mask 240 that are protected by the photoresist 241 remain residing over the first hard mask 220. The photoresist 241 may be a negative or positive photoresist, for example. The remaining photoresist 241 is then removed.

Next, the pattern 242 is transferred from the oxide mask 240 to the first hard mask 220. Similarly, the first hard mask 220 is etched such that exposed portions of the first hard mask 220 are removed, while portions of the first hard mask 220 protected by the oxide mask 240 remain residing over the second magnetic material 216. The remaining oxide mask 240 is removed from over the first hard mask 220.

Figure 5:
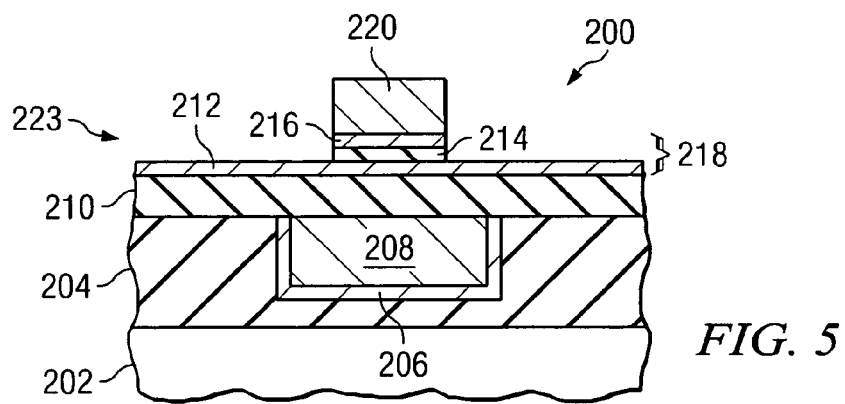

The patterned first hard mask 220 is then used to pattern the second magnetic layer 216 and the tunnel insulator 214, as shown in FIG. 5. The second magnetic layer 216 and the tunnel insulator 214 are patterned using the first hard mask as a mask. For example, the second magnetic material 216 and tunnel insulator 214 may be exposed to an etch process such as a RIE, and exposed portions of the second magnetic layer 216 and tunnel insulator 214 may be removed. The first hard mask 220, second magnetic layer 216, and the tunnel insulator 214 comprise a first pattern.

In one embodiment, the first hard mask 220 is preferably left remaining in the structure 200, rather than removing it. Because the first hard mask 220 is conductive, it may be used to make electrical contact to the top second magnetic layer 216, for example.

Figure 6:
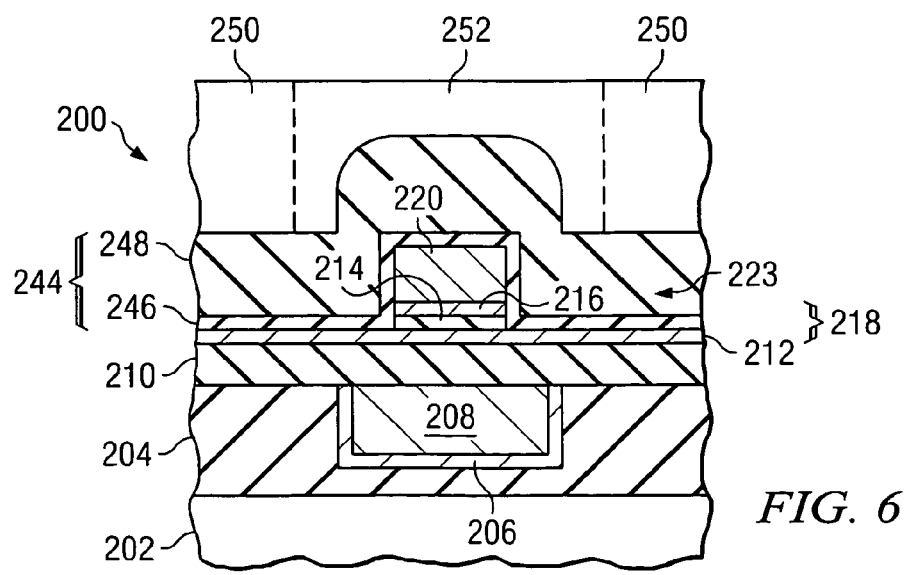

In accordance with a preferred embodiment of the present invention, a second hard mask 244 comprising a first material 246 and a second material 248 is next deposited over the patterned first hard mask 220, the patterned second magnetic layer 216, the patterned tunnel insulator layer 214, and exposed portions of the first magnetic layer 212, as shown in FIG. 6. The first material 246 of the second hard mask 244 preferably comprises a thin insulating material that is etch-resistant. For example, the first material 246 may comprise SiC, SiCO, SiN, or combinations thereof, as examples. The first material 246 may comprise BLoK™ or n-BLoK™ by Allied Materials, as examples. The first material 246 may alternatively comprise other materials, for example.

In one embodiment, the first material 246 comprises a "hard mask layer" of the second hard mask 244. The first material 246 is preferably thin relative to the thickness of the second material 248. For example, the first material 246 preferably comprises about 250 Angstroms or less of material, in one embodiment. The first material 246 may alternatively comprise other dimensions, for example.

The first material 246 is preferably substantially conformal to the underlying topography of the structure 200 in one embodiment, as shown in FIG. 6. In particular, the conformal first material 246 preferably comprises a top surface having substantially the same topography as the underlying exposed first magnetic material 212, the sidewalls of the patterned tunnel insulator 214, the second magnetic layer 216, and the first hard mask 220, and the top surface of the patterned first hard mask 220. The first material 246 in this embodiment may have a topography including features with sidewalls that are substantially perpendicular to a horizontal surface of the workpiece 202, as shown.

The second material 248 of the second hard mask 244 is then deposited or formed over the first material 246. In this embodiment, preferably, the second material 248 preferably comprises an insulating material that is less etch-selective than the first material 246. For example, if the first material 246 comprises SiC or SiCO, the second material 248 may comprise silicon dioxide, photoresist, or silicon nitride, as examples. In another embodiment, if the first material 246 comprises SiN, the second material 248 preferably comprises silicon dioxide or photoresist, for example. The second material 248 may alternatively comprise other materials, for example. In one embodiment, the second material 248 preferably comprises a material that etches at a rate of at least about ten times faster than the first material 246 etches, for example.

The second material 248 comprises a "soft mask layer" of the second hard mask 244. The second material 248 of the second hard mask 244 is also preferably considerably thicker than the first material 246. For example, the second material 248 preferably comprises a thickness of about 1500 to 6000 Angstroms, and more preferably comprises a thickness of about 1000 Angstroms or more. The ratio of the thicknesses of the first material 246 and the second material 248 is a function of the etch selectivity of the first and second material 246 and 248, for example.

The second material 248 preferably is also substantially conformal to the topography of the underlying first material 246 in this embodiment, as shown in FIG. 6. In particular, the conformal second material 248 preferably comprises a top surface having substantially the same topography as the underlying first material 246. The second material 248 in this embodiment may have a topography including features with sidewalls that are substantially perpendicular to a horizontal surface of the workpiece 202, as shown. In another embodiment, to be described further herein with reference to FIG. 10, the second material may be non-conformal.

Referring again to FIG. 6, the second hard mask 244 is then patterned with the desired pattern for the bottom layer or first magnetic material 212 of the MTJ 223 or magnetic stack 218. For example, a photoresist 250 may be deposited over the second hard mask 244, and the photoresist 250 may be patterned with a pattern 252, as shown. The photoresist pattern 252 is preferably larger, e.g., wider in at least one direction horizontally across the workpiece 202, than the pattern 242 (see FIG. 4) for the second magnetic layer 216 and tunnel insulator layer 214.

Figure 7:
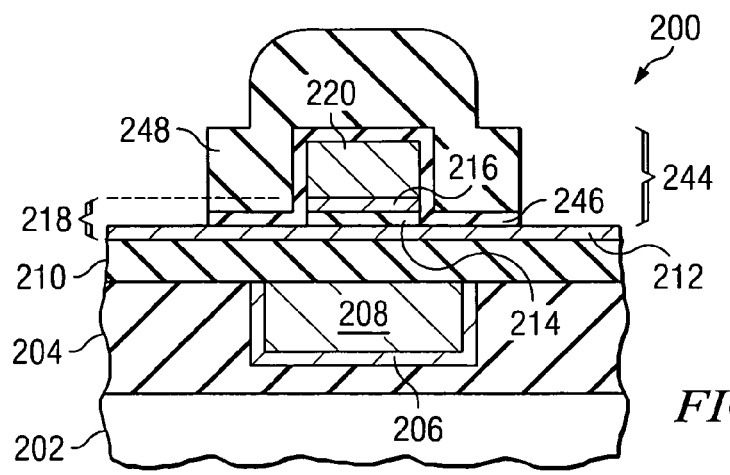

The photoresist pattern 252 is then transferred to both the second material 248 and the first material 246 of the second hard mask 244, as shown in FIG. 7. For example, the second material 248 and the first material 246 may be etched using the photoresist 250 as a mask. The photoresist 250 is then removed. Alternatively, an oxide mask may be used to pattern the second hard mask 244, for example (not shown in FIG. 6: this process is similar to that described to pattern the first hard mask 220 as shown in FIG. 4).

Figure 8:
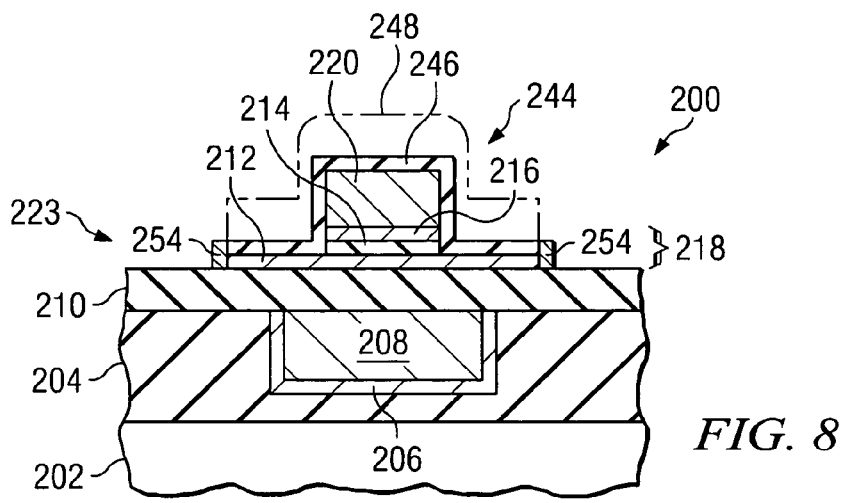
Figure 9A:
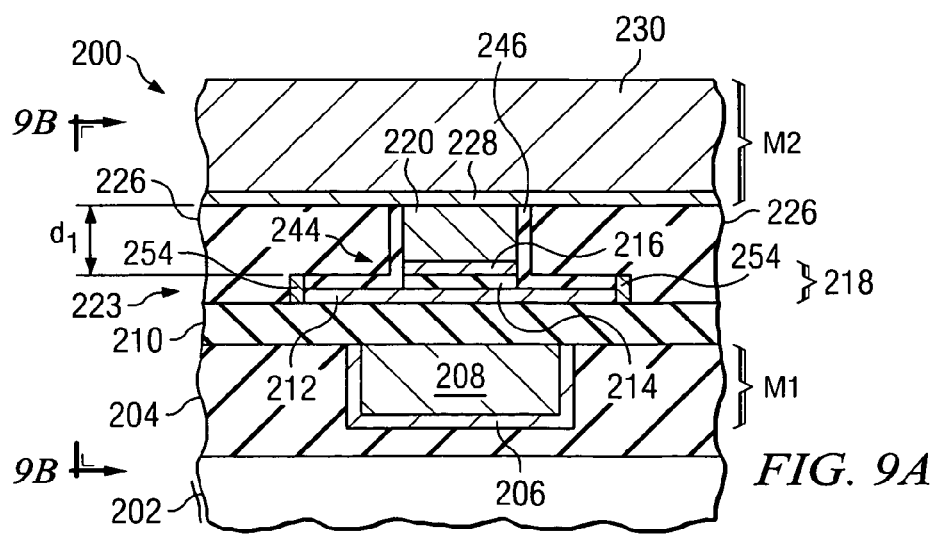

The first magnetic layer 212 of the magnetic stack 218 is then patterned using the second hard mask 244 as a mask, as shown in FIG. 8, forming at least one MTJ 223. The first magnetic layer and the second hard mask 244 comprise a second pattern, wherein the second pattern has a larger footprint than the first pattern. The term "footprint" as used herein refers to a horizontal feature size of a device formed over the workpiece. For example, as can be seen in FIG. 9A, the first magnetic layer 212 has a horizontal width that is greater than the horizontal width of the tunnel insulator 214 and second magnetic layer 216. In a view rotated about 90 degrees from the view shown, the first pattern of the tunnel insulator 214 and second magnetic layer 216 may have the same, or a different, horizontal width than the second pattern of the first magnetic layer 212, for example (not shown).

The MTJ 223 comprises the patterned magnetic layers 212 and 216 and tunnel insulator 214. In the patterning process for the MTJ 223 described herein, exposed portions of the first magnetic layer 212 are etched away, using a wet etch chemistry or a RIE, as examples, although alternatively, other etch chemistries and processes may be used to etch away or remove portions of the first magnetic layer 212. Portions of the first magnetic layer 212 are protected from the etch process by the second hard mask 244.

Preferably, according to one embodiment of the present invention, at least a portion of the second material 248 of the second hard mask 244 is removed or eroded during the etch process of the first magnetic layer 212, leaving a portion of the second material 248 left remaining over the first material 248, as shown in phantom in FIG. 8. In another embodiment, all of the second material 248 of the second hard mask 244 is removed during the etch process of the first magnetic layer 212, also shown in FIG. 8. Thus, in this embodiment, the second material 248 is sacrificially removed during the etch process of the first magnetic layer 212 of the MTJ 223.

Because the first material 246 of the second hard mask 244 is preferably etch-resistant in this embodiment, substantially all of the first material 246 remains after etching the first magnetic layer 212. However, if all of the second material 248 is removed during the etch process of the first magnetic layer 212, the thin first material 246 may exhibit minor damage at exposed corners, for example.

In one embodiment, during a first portion of the etch process to etch the first magnetic material 212, the second material 248 of the second hard mask 244 protects the underlying first material 246 and portions of the first magnetic material 212 from being etched away. The second material 248 is gradually etched away during the etch process. At a certain point in the etch process, depending on the thickness of the second material 248 and the type of material used for the second material 248, all of the second material 248 may be entirely removed from the top surface of the first material 246. At this point, during a second portion of the etch process to etch the first magnetic material 212, the first material 246 of the second hard mask 244 protects underlying portions of the first magnetic layer 212 from being etched away. In one embodiment, portions of the first material 246 may be left remaining in the structure 200 after the etch process for the first magnetic material layer 212 is completed. In this embodiment, the first material 246 preferably comprises a material that is highly selective to the etch chemistry for the first magnetic layer 212.

In another embodiment, a portion of the soft mask material (second material 248) is left remaining at the end of the etch process to pattern the first magnetic layer 212. A strip process such as a wet buffered hydrofluoric acid is then used to remove the remaining second material 248 from over the top surface of the first material 246, although the strip process may alternatively comprise other methods and chemistries, for example. The strip process preferably also removes any conductive fences 254 (see FIG. 8) that may have formed on the vertical sidewalls of the first material 246 and on vertical sidewalls of the second material 248 (not shown). In this embodiment, the via level ILD (second insulating layer 210) preferably comprises a material that is resistant to the strip process, in order to avoid an undercut of the MTJ 223.

Preferably, the thicknesses of the first material 246 and second material 248 of the second hard mask 244 are selected so that the final structure has no fences formed on the sidewalls of the first material 246. However, because in this embodiment the second material 248 and first material 246 are conformal and may comprise vertical sidewalls positioned at a substantially 90° angle to a horizontal surface of the workpiece 202, it is possible that during the etch process of the first magnetic layer 212, fences 254 comprising a conductive material or metal, as examples, may be formed on the sidewalls of the first material 246, as shown in FIG. 8. When second conductive lines 228/230 are subsequently formed over the MTJ's 223, as shown in FIGS. 9A and 9B, advantageously, shorting does not occur between the fences 254 and the conductive lines 228/230 in the second metallization layer M2 because the fences 254 are spaced apart from the second conductive lines 228/230 by a distance $d_1$ which may comprise a distance of about 1600 Angstroms or more, for example, although distance $d_1$ may alternatively comprise other dimensions.

The second conductive lines 228/230 may be formed using a damascene process. For example, a third insulating layer 226 is deposited over the patterned MTJ's 223 and first material 246. The third insulating layer 226 is patterned with a pattern for second conductive lines 228/230. A portion of the first material 246 is removed from over the first hard mask 220 so that electrical contact may be made to the top surface of the first hard mask 220. An optional second conductive liner 228 may be deposited over the patterned third insulating layer 226. A conductive material 230 is deposited over the conductive liner 228, and a chemical-mechanical polish (CMP) process is used to remove excess conductive material 230 and conductive liner 228 from over the top surface of the third insulating layer 226, forming the second conductive lines 228/230. Alternatively, the plurality of second conductive lines 228/230 may be formed using a subtractive etch process, for example.

Figure 9B:
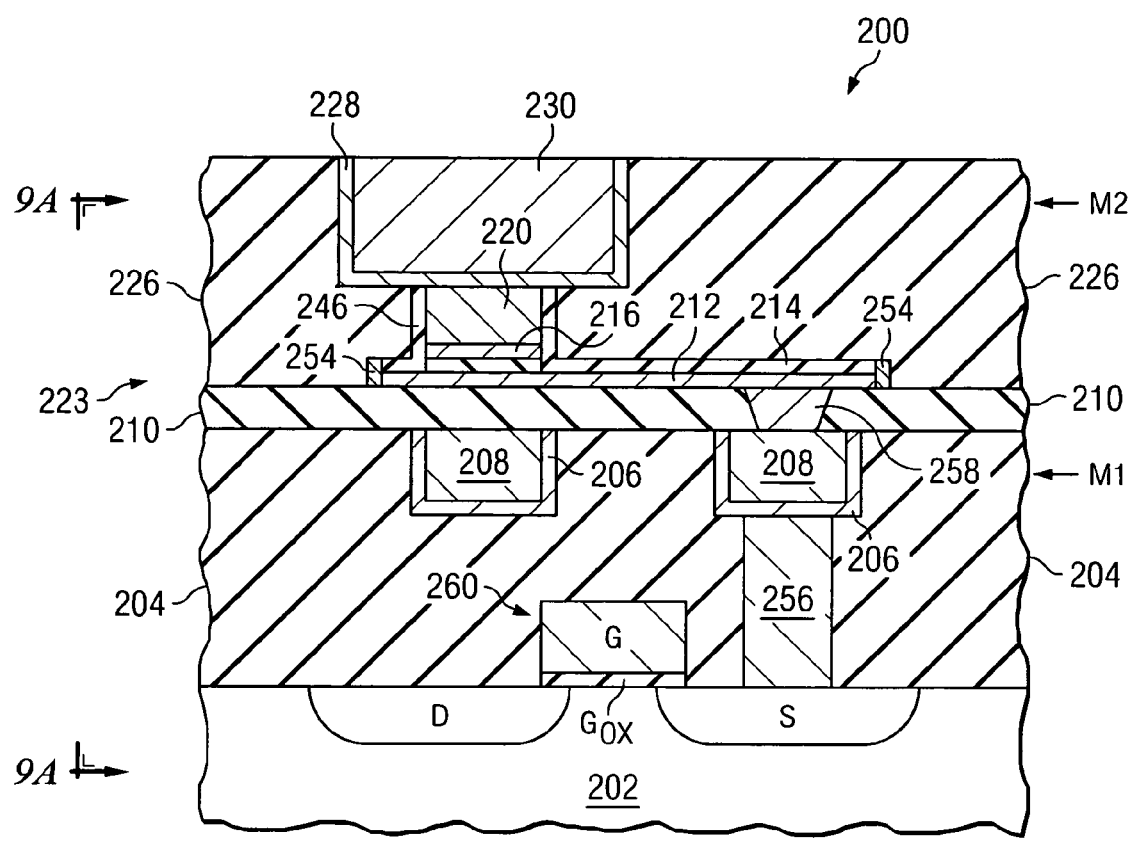

A cross-sectional view rotated 90° from the view shown in FIG. 9A is shown in FIG. 9B. Component region 260 comprising a FET has been formed in and over the workpiece 202. The FET 260 includes a source S and drain D formed in the workpiece 202, a gate oxide $G_{ox}$ formed over the other portions of the source S and drain D, and a gate G formed over the gate oxide $G_{ox}$. Contacts 256 are formed within the first insulating layer 204 to provide electrical contact between the source S of the FET 260 and a first conductive line 206/208 in the first metallization layer M1. A via 258 may be formed in the second insulating layer 210, as shown, to provide electrical connection between the first conductive line 206/208 and the first magnetic layer 212 of the MTJ 223.

The second conductive lines 228/230 may comprise bitlines of an MRAM array, and the first conductive lines 206/208 may comprise wordlines, for example. Alternatively, the converse may be true. For example, the second conductive lines 228/230 may comprise wordlines of an MRAM array, and the first conductive lines 206/208 may comprise bitlines. The FET 260, bitlines 228/230 or 206/208, and wordlines 206/208 or 228/230 may be used to select a particular MRAM memory cell 223, for example, in an FET memory array application.

In second and third embodiments of the present invention shown in FIGS. 10 and 11–14, respectively, the hard mask used to pattern the bottom or first magnetic layer of an MTJ is preferably non-conformal and smoothes the topography of the underlying features. As described previously herein, fence formation on sidewalls of features is essentially a competition between re-deposition and sputtering-out of materials at a sidewall. If the re-deposition rate is higher than the sputter rate, a fence will be formed. The sputter rate is a function of the features of the topography. The more steep the topography is, and the closer to 90 degrees the topography is, the lower the sputtering yield and the more likely it is that a fence will be formed on vertical sidewalls. Because the hard masks shown in the embodiments shown in FIGS. 10 and 11–14 are non-conformal, the topography of the hard masks is tapered and smooth, and absent any substantially 90 degree features to the horizontal surface of the workpiece, due to the non-conformal flow characteristics of the materials used for the hard mask, advantageously thus preventing the formation of fences.

Figure 10:
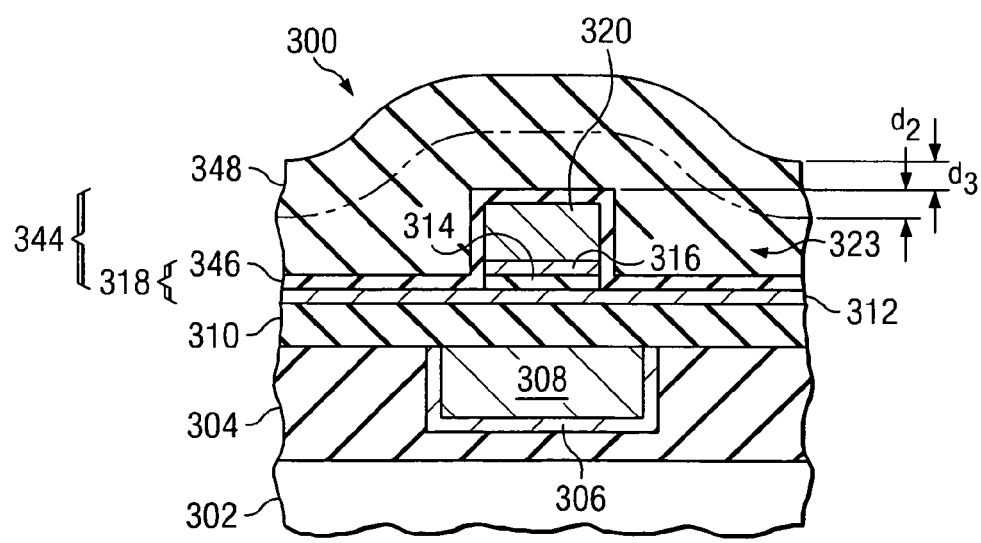
FIG. 10 shows another embodiment of the present invention, wherein a top-most or second material of the two layer hard mask shown in FIGS. 4 through 9A and 9B comprises a non-conformal, topography-smoothing material.

In the embodiment of the present invention shown in FIG. 10, the second or top-most material 348 of the two layer hard mask 344 preferably comprises a non-conformal, topography-smoothing material. Again, to avoid repetition, each reference number shown in FIG. 10 may not necessarily be described again in detail herein, and similar materials are preferably used for the material layers shown (other than the second material 348) as were described for the previously described figures.

The non-conformal second material 348 preferably comprises spin-on glass (SOG), SILK™ available from Dow Chemical, or high density plasma silicon nitride (HDP SiN), as examples, although alternatively, the second material 348 may comprise other non-conformal insulators, for example. The second material 348 preferably is deposited in a thickness of about 1500 to 6000 Angstroms, as an example, although the second material 348 may be alternatively deposited in other thicknesses.

When deposited over the substantially conformal first material 346, the non-conformal second material 348 preferably comprises an angle of less than about 85° with respect to a horizontal surface of the workpiece 302 over topography features of the underlying first material 346, in particular, for example, proximate corners at the edges of the patterned first hard mask 320, second magnetic layer 316, and tunnel insulator 314, as shown. Because no substantially 90 degree angles exist in the top surface of the smoothed topography of the second material 348 of the second hard mask 344 in this embodiment, no metal fences form while the first magnetic layer 312 is etched using the second hard mask 344 as a mask. Thus, shorts to subsequently formed metallization layers are prevented by this embodiment of the present invention.

In this embodiment, the second material 348 may be lower than a top surface of the first material 346 between topographical features by a distance of $d_2$, as shown in phantom in FIG. 10. Alternatively, the second material 348 may be higher than the top surface of the first material 346 between topographical features by a distance of $d_3$, also shown. Distances $d_2$ and $d_3$ may comprise a few to a few hundreds of Angstroms, for example.

As in the embodiment shown in FIGS. 4 through 9A and 9B, a portion, or all, of the conformal second material 348 may be removed during the patterning of the first magnetic layer 312, as shown in FIG. 10. If some of the second material 348 remains after the etch process, all or a portion of the remaining second material 348 may be removed before forming the second conductive lines as described with reference to FIG. 9A. For example, the second material 348 may be etched or stripped away. Alternatively, a CMP process may be used to remove the second material 348 and first material 346 from over the top surface of the first hard mask 320, so that subsequently formed second conductive lines (not shown) will make electrical contact to the first hard mask 320 and thus the at least one MTJ 323. The amount of second material 348 left remaining over insulating layer 310 may comprise a thickness of about 1500 to 3000 Angstroms, for example.

FIGS. 11 through 14 show another preferred embodiment of the present invention, wherein a non-conformal hard mask 444 comprising a single layer of material 448 is used to pattern the lower magnetic material layer 412 of magnetic memory cells 423. Again, to avoid repetition, each reference number shown in FIGS. 11 through 14 may not necessarily be described again in detail herein, and similar materials are preferably used for the material layers shown as were described for the previously described figures.

In this embodiment, the single layer of material 448 used for the second hard mask 444 is preferably a non-conformal and topography-smoothing material. The non-conformal second hard mask 444 preferably comprises spin-on glass (SOG), SILK™, or high density plasma silicon nitride (HDP SiN), as examples, although alternatively, the second hard mask 444 may comprise other non-conformal insulators, for example. The second hard mask 444 preferably is deposited in a thickness of about 1500 to 6000 Angstroms, as an example, although the single layer second hard mask 444 may be alternatively deposited in other thicknesses.

When deposited over the patterned top surface of the first hard mask 420 and the sidewalls of the first hard mask 420, second magnetic layer 416 and tunnel insulator 414, non-conformal second hard mask 444 preferably comprises an angle of less than about 85° with respect to a horizontal surface of the workpiece 402 over topography features, in particular, for example, proximate corners at the edges of the patterned first hard mask 420, second magnetic layer 416, and tunnel insulator 414, as shown. More preferably, the angle α between a horizontal surface of the second hard mask 444 and a portion of the second hard mask 444 does not exceed about 45 degrees, in one embodiment. The second hard mask 444 between features may comprise a distance $d_4$ beneath a top surface of the first hard mask 420, as shown, wherein the distance $d_4$ comprises a few to about 100 Angstroms, as an example, although $d_4$ may alternatively comprise other dimensions.

Because no substantially 90 degree angles exist in the top surface of the smoothed topography of the second hard mask 444 in this embodiment, no metal fences form while the first magnetic layer 412 is etched using the second hard mask 444 as a mask. Thus, shorts to subsequently formed metallization layers are prevented by this embodiment of the present invention.

Figure 11:
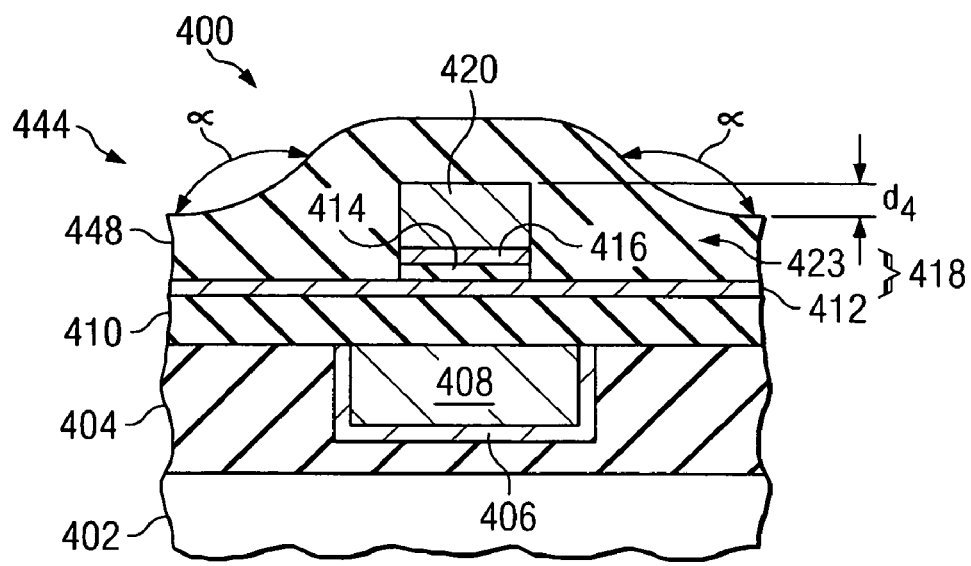
FIGS. 11 through 14 show another embodiment of the present invention, wherein a non-conformal hard mask comprising a single layer of material is used to pattern the lower magnetic material layers of magnetic memory cells.
Figure 12:
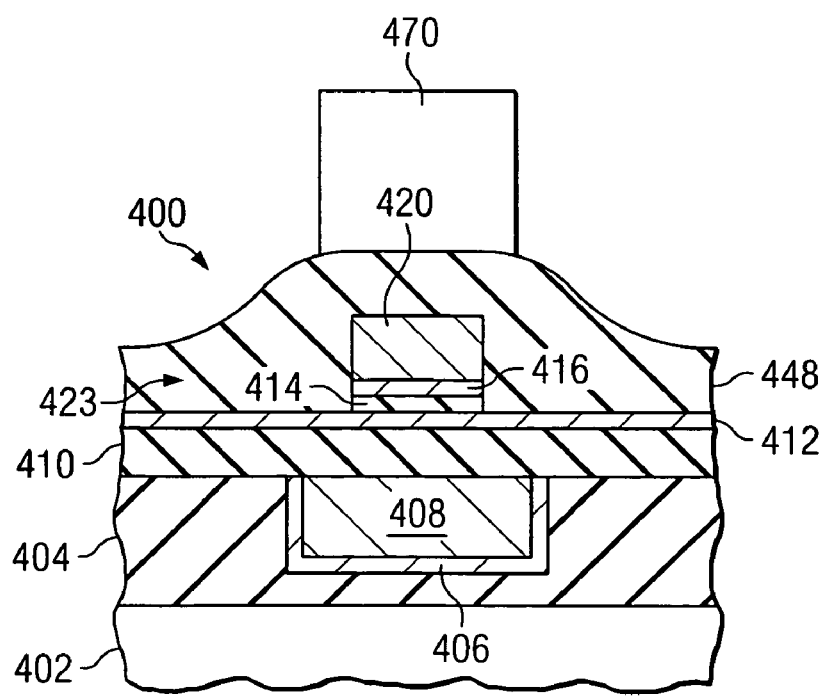
Figure 13:
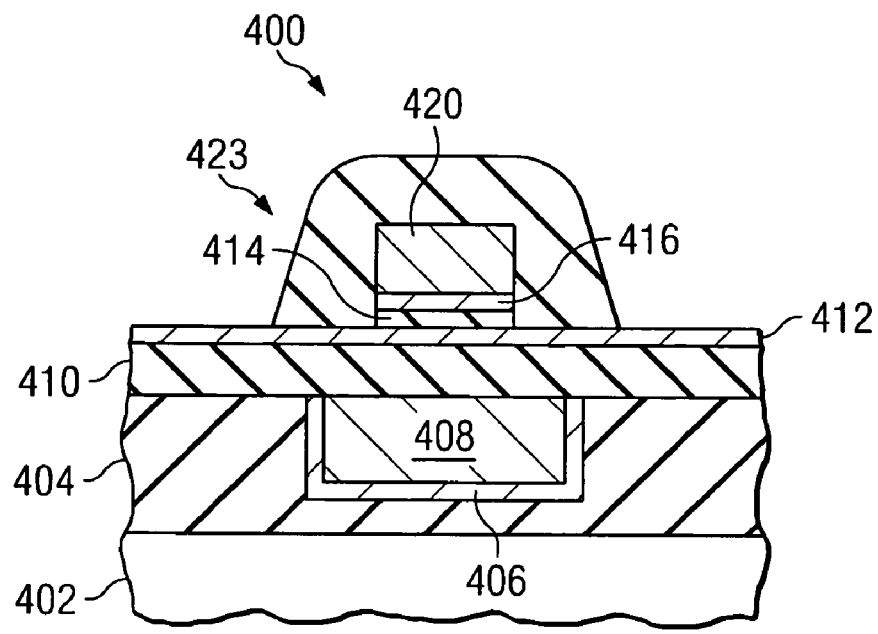

In this embodiment, after the non-conformal second hard mask 444 is deposited and smoothes the topographical features over the workpiece 402, as shown in FIG. 11, a photoresist 470 is used to pattern the non-conformal second hard mask 444, as shown in FIG. 12. The second hard mask 444 over the top of the first hard mask 420 is protected by resist while an etch process, e.g., using an anisotropic etch process, is used to remove portions of the second hard mask 444 from between the patterned tunnel insulator 414, second magnetic layer 416, and first hard mask 420, as shown in FIG. 13. More of the second hard mask 444 may be removed from over horizontal surfaces than from vertical surfaces, exposing portions of the first magnetic layer 412, as shown.

Figure 14:
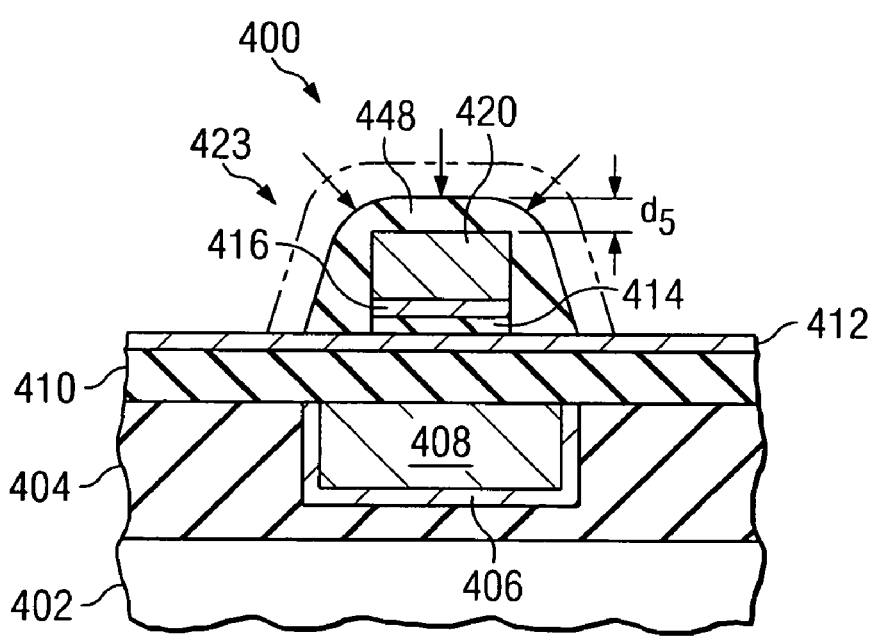

The second hard mask 444 is then used as a mask to pattern the first magnetic layer 412, leaving the structure shown in FIG. 14. A portion of the second hard mask 444 may be removed during the etch process, as shown. A portion of the second hard mask 444 having downwardly sloping sidewalls may remain over the top surface of the first hard mask 420 and sidewalls of the first magnetic layer 412, the tunnel insulator 414 and the second magnetic layer 416, as shown. The amount of second hard mask 444 may comprise about 3000 Angstroms or less, e.g., about 1500 to 3000 Angstroms disposed over sidewalls of the patterned MTJ's 423.

The second hard mask may comprise a dimension $d_5$ over the top surface of the first hard mask 420 after patterning the first magnetic layer 412, as shown. The dimension $d_5$ may comprise a few to about 100 Angstroms, as an example, although $d_5$ may alternatively comprise other dimensions. A CMP process may be used to remove any excess second hard mask 444 from over the top surface of the first hard mask 420, so that subsequently formed second conductive lines (not shown) will make electrical contact to the first hard mask 420 and thus the at least one MTJ 423.

Advantages of embodiments of the present invention include providing methods of forming an MTJ or magnetic memory cell 223/323/423, wherein shorts are not caused by metal fences 254 that may form on the sidewalls of the hard mask 244 used to pattern lower magnetic material layers during the etching process used to pattern the lower magnetic material layer. Because at least a portion of the second material 248 of the second hard mask 244 (shown in FIG. 7) may be sacrificially removed during the patterning of the first magnetic layer 212, or because the second material 248 may have an angle of about 85° or less with respect to a horizontal surface of the workpiece 302, fences cannot be formed that would have a height great enough to make electrical contact to subsequently-formed second connective lines 228/230 shown in FIG. 9A. Rather, fences 254 that may form on the sidewalls of the second material 246 of the second hard mask 244 are separated from the second conductive lines 228/230 by a distance $d_1$, or, if a non-conformal material is used for the second material 346 or single layer hard mask 444, no fences are formed. Thus, the method of manufacturing and structure for a magnetic memory device 200/300/400 described herein prevent shorts, reduce device failures, and improve device yields.

Advantageously, no additional lithography masks are required by embodiments of the present invention. Furthermore, the first material 246/346 of the second hard mask 244/344 comprises a high quality, hard material that also functions as an MTJ 223/323 encapsulation material.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
    providing a workpiece;
    depositing a first magnetic layer over the workpiece;
    depositing a tunnel insulator over the first magnetic layer;
    depositing a second magnetic layer over the tunnel insulator, wherein the second magnetic layer, tunnel insulator, and first magnetic layer form a magnetic stack;
    depositing a first hard mask over the second magnetic layer;
    patterning the first hard mask;
    patterning the second magnetic layer and the tunnel insulator using the first hard mask as a mask;
    depositing a first material over the first hard mask;
    depositing a second material over the first material, wherein the first material and second material form a second hard mask;
    patterning the second material and the first material; and
    patterning the first magnetic layer using the second hard mask as a mask, wherein the patterned first magnetic layer, tunnel insulator, and second magnetic layer comprise at least one magnetic tunnel junction (MTJ).

2. The method according to claim 1, wherein depositing the first material comprises depositing an etch-resistant material, and wherein depositing the second material comprises depositing a material that is less etch resistive than the first material.

3. The method according to claim 2, wherein the first material etches at a first etch rate, wherein the second material comprises a second etch rate, wherein the second etch rate is about ten times faster than the first etch rate.

4. The method according to claim 1, wherein depositing the first material comprises depositing a conformal material, wherein depositing the second material comprises depositing a conformal material.

5. The method according to claim 4, wherein patterning the first magnetic layer comprises an etch process, wherein at least a portion of the second material is removed during the etch process.

6. The method according to claim 5, wherein all of the second material is removed during the etch process.

7. The method according to claim 5, wherein only a portion of the second material is removed during the etch process, further comprising removing the remaining second material from over the first material.

8. The method according to claim 5, wherein the etch process comprises a wet etch process or a reactive ion etch (RIE) process.

9. The method according to claim 5, further comprising;
    forming an insulating layer over the at least one MTJ; and
    forming a plurality of conductive lines in the insulating layer, wherein the first material comprises sidewalls, wherein metal fences form on at least the sidewalls of the first material during the etch process, wherein the metal fences do not form shorts between the at least one MTJ and the conductive lines.

10. The method according to claim 4, wherein depositing the second material over the first material comprises depositing silicon dioxide, photoresist, silicon nitride, or combinations thereof.

11. The method according to claim 10, wherein depositing the second material comprises depositing about 1500 to 6000 Angstroms of material.

12. The method according to claim 10, wherein depositing the first material comprises depositing about 250 Angstroms or less of material.

13. The method according to claim 1, wherein depositing the first material comprises depositing SiC, SiCO, SiN, BLoK™, n-BLoK™ or combinations thereof.

14. The method according to claim 13, wherein depositing the second material comprises depositing about 1500 to 6000 Angstroms of silicon dioxide, photoresist, silicon nitride, or combinations thereof.

15. The method according to claim 1, wherein depositing the second material over the first material comprises depositing a non-conformal material, wherein the second material comprises an angle of less than about 85° with respect to a horizontal surface of the workpiece proximate the first hard mask, the second magnetic layer, and the tunnel insulator.

16. The method according to claim 15, wherein patterning the first magnetic layer comprises an etch process, wherein metal fences do not form over the angle of less than about 85° of the second material proximate the first hard mask, the second magnetic layer, and the tunnel insulator during the etch process.

17. The method according to claim 16, wherein depositing the second material over the first material comprises depositing spin-on glass (SOG), SILK™, or high density plasma silicon nitride (HDP SiN).

18. The method according to claim 1, wherein depositing the first hard mask comprises depositing about 1500 Angstroms of TiN, Ta, TaN, or combinations thereof.

19. The method according to claim 1, further comprising:
   forming a first insulating layer over the workpiece, before depositing the first magnetic layer;
   forming a plurality of first conductive lines in the first insulating layer, the first conductive lines running in a first direction, wherein depositing a first magnetic layer over the workpiece comprises depositing the first magnetic layer over the first insulating layer and the first conductive lines, and wherein the at least one MTJ is disposed over at least one of the plurality of first conductive lines;
   forming a second insulating layer over the first insulating layer and the at least one MTJ; and
   forming a plurality of second conductive lines in the second insulating layer, the second conductive lines running in a second direction, the second direction being different from the first direction.

20. The method according to claim 19, wherein the semiconductor device comprises a field-effect transistor (FET) magnetic random access memory (MRAM) device, wherein the plurality of first conductive lines and the plurality of second conductive lines comprise wordlines and bitlines of the MRAM device, and wherein the at least one MTJ comprises a plurality of magnetic memory cells.

* * * * *